United States Patent [19]

Pfaff

[11] 4,304,514

[45] Dec. 8, 1981

[54] CIRCUIT PACKAGE LOADER AND EXTRACTOR

[75] Inventor: Wayne K. Pfaff, Irving, Tex.

[73] Assignee: Thermalloy Incorporated, Dallas, Tex.

[21] Appl. No.: 93,626

[22] Filed: Nov. 13, 1979

[51] Int. Cl.³ .................................... B65G 47/06
[52] U.S. Cl. ............................... 414/224; 414/610; 414/661
[58] Field of Search ............. 414/222, 224, 554, 610, 414/661; 209/573; 29/741, 742, 747, 718, 831, 729

[56] References Cited

U.S. PATENT DOCUMENTS

| | | | |
|---|---|---|---|
| 3,442,430 | 5/1966 | Ackerman et al. | 29/729 X |
| 3,545,064 | 12/1970 | Zemek et al. | 29/718 |
| 3,662,881 | 5/1972 | Fineran | 414/222 X |
| 3,727,757 | 4/1973 | Boissicat | 209/573 |
| 4,222,166 | 9/1980 | Kurek et al. | 29/831 |

*Primary Examiner*—Nicholas P. Godici
*Assistant Examiner*—C. J. Arbes
*Attorney, Agent, or Firm*—Kanz & Timmons

[57] ABSTRACT

An apparatus for loading circuit packages having a first support surface (36) for supporting a circuit package and a pressure pad (38) spaced apart from the support surface (36) for applying pressure to a circuit package is disclosed. A second support surface (48) which is substantially in line with the first support surface supports a circuit package for unloading. The support surfaces move in a direction substantially perpendicular to the plane of the surfaces so that circuit packages are inserted straight into their sockets and removed straight from their sockets. A gravity circuit package feeder (20) feeds circuit packages onto the first support surface. A circuit package stop (54) is located at the end of first support surface opposite the gravity feeder (20). The support surfaces are inclined to the horizontal so that a circuit package comes to rest against the circuit package stop. A roller (56) is spaced apart from the second support surface (48) for applying pressure to the top of a circuit package being unloaded. The roller (56) moves from the upper end of the second support surface toward the lower end of the second support surface for ejecting circuit packages onto an unloading gravity feeder (22).

8 Claims, 4 Drawing Figures

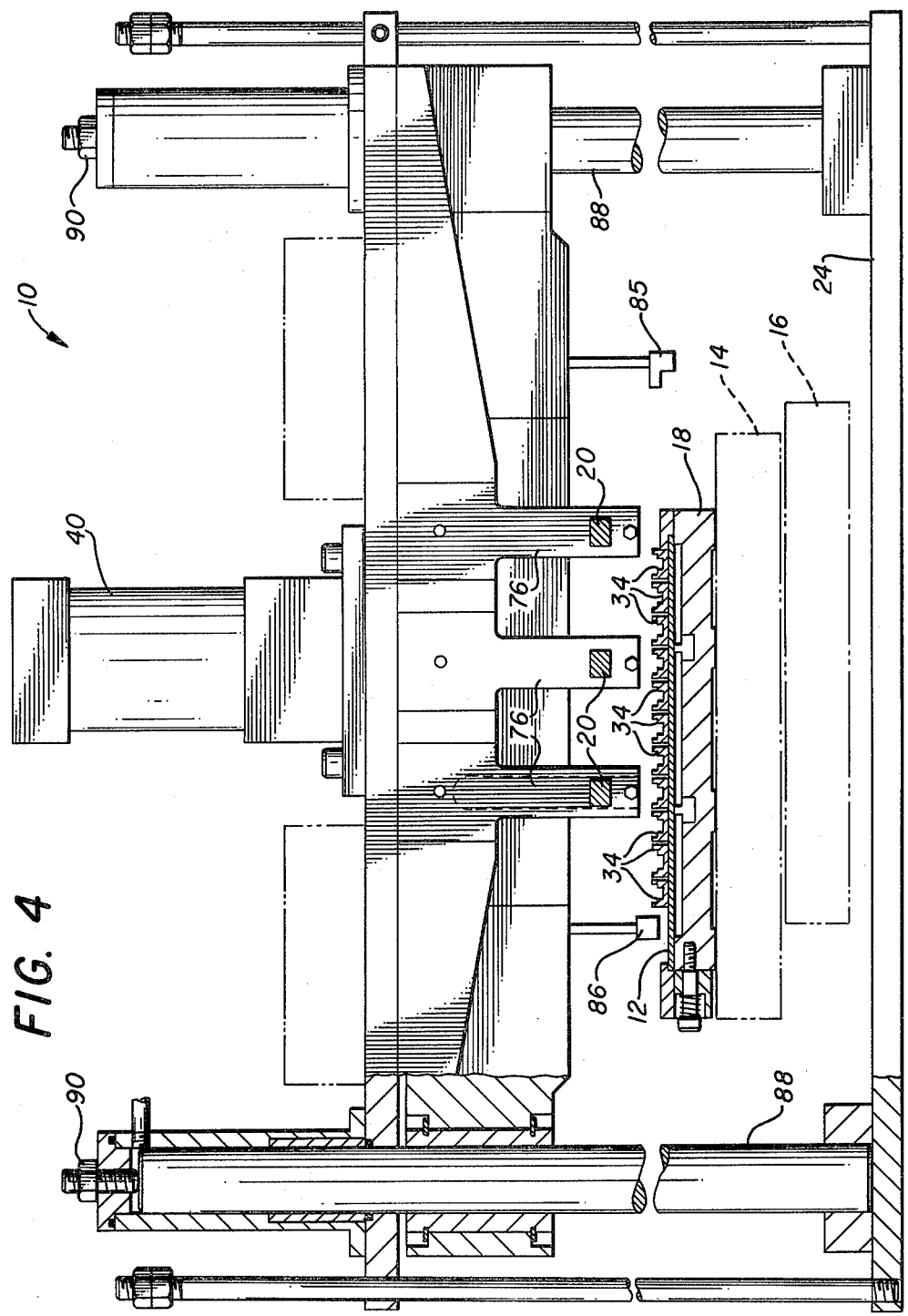

CIRCUIT PACKAGE LOADER AND EXTRACTOR

DESCRIPTION

Technical Field

The present invention relates generally to automatic loaders and extractors for electrical circuit packages, and in one of its aspects, to an automated burn-in board loader. In another aspect, the invention relates to automated burn-in board loaders and extractors for dual in-line packages.

Standard electrical industry practice for quality control of dual in-line packages known as DIP's is known as "burn-in" and involves stressing the DIP's both thermally and electrically. Burn-in is performed by inserting the DIP's into sockets which are arranged on a burn-in board in rows and columns. The burn-in tests are performed on the DIP's which are inserted into the sockets of the burn-in board. When the burn-in tests are complete, the DIP's are removed from the sockets with those that have failed a test being thrown away and those which have passed the tests being processed for further use. In the past, DIP's were frequently selected at random for testing, but with the advance of medium and large scale integration, which allows several hundred TTL transistors and up to sixty-four thousand memory elements on a single chip, it is not uncommon to test every DIP.

BACKGROUND ART

It is not uncommon to load and unload burn-in boards by hand, although grippers designed for printed circuit board loading are also frequently used for loading burn-in boards. The grippers grip the sides of a DIP and push the DIP into a socket. Since the ceramic unit DIP's are constructed having upper and lower substrates, which can be skewed relative to each other, gripping the DIP's by the sides as done by the grippers can cause damage to the packages. In addition, failure to accurately locate the packages with respect to the sockets causes frequent bending of the DIP pins which necessitates a pin straighting process in association with the burn-in board loading and unloading. A "sword" is frequently used for unloading the DIP's, the sword being simply a long straight piece of metal. The sword is slid through the extraction slots underneath a row of DIP's. Once inserted down the extraction slot of the row of DIP's, the sword is lifted at the user end, pushing the DIP's out of the sockets. Pushing the DIP's out of their sockets at an angle causes frequent pin damage.

DISCLOSURE OF INVENTION

The present invention concerns an apparatus for loading a circuit package into a socket or removing a circuit package from a socket. The apparatus includes a support surface for supporting the circuit package and means for moving the support surface toward the socket for loading the circuit package into the socket and away from the socket for removing the circuit package from the socket. The support surface and package are moved in a direction substantially perpendicular to the plane of the support surface so that the pins are inserted directly into the socket and removed directly away from the socket.

An apparatus for loading a first circuit package into a first socket includes a first support surface for supporting the first circuit package from underneath the package, a pressure pad spaced apart from the first support surface for applying pressure to a circuit package when the circuit package is being loaded into the socket, and a means for moving the first support surface and pressure pad toward the first socket in a direction substantially perpendicular to the plane of the first support surface for loading the circuit package into the first socket.

For an arrangement such as a burn-in board where a second socket is substantially in line with the first socket, an apparatus for extracting a second circuit package from the second socket includes a second support surface substantially in line with the first support surface for supporting the second circuit package while the second circuit package is being removed from the second socket, and a means for moving the second support surface away from the second socket in a direction substantially perpendicular to the plane of the second support surface for unloading the second circuit package.

In one arrangement of an apparatus according to the present invention especially adapted for gravity feeding of circuit packages to the loader and from the unloader, the support surfaces are inclined to the horizontal with the first support surface higher than the second support surface. The apparatus includes a circuit package stop located at the lower end of the first support surface, a roller spaced apart from the second support surface for applying pressure to the top of the second circuit package, and means for moving the roller toward the upper end of the second support surface when positioning the second circuit package opposite the second support surface and toward the lower end of the second support surface for ejecting the second circuit package from the second support surface when the second circuit package has been extracted from the second socket.

One such arrangement includes a means for fixing the position of the first and second support surfaces relative to each other. The second support surface aligns with the first support surface so that the means for moving the first support surface and pressure pad toward the first socket and the means for moving the second support surface away from the second socket move both the first and second support surfaces together. The apparatus also includes the means for moving the sockets with respect to the support surfaces when the circuit packages are loaded in their respective sockets. The sockets are moved in a direction substantially parallel to the support surfaces. The first circuit package is moved away from the circuit package stop until it is clear of the first support surface while positioning the second circuit package opposite the second support surface at the same time. A gravity circuit package feeder is substantially in-line or slightly above the first support surface. The gravity circuit package feeder feeds the first circuit package onto the first support surface. Similarly, a gravity circuit package feeder is substantially in-line with or slightly below the second support surface. The second circuit package is fed from the second support surface onto the second gravity feeder for automatically taking the second circuit package away from the apparatus once it has been unloaded.

One means for moving the roller includes the combination of a lever located above and predominantly perpendicular to the second support surface, means for rotatably attaching the roller to the lower end of the lever, a cam follower attached to the upper end of the lever, and a cam in contact with the cam follower whereby moving the second support surface away from the second socket moves the roller toward the lower end of the second support surface. In one arrangement, the lever is L shaped. The end of the lever opposite the roller bends back in the direction of the first support surface and hits a stop as the second support surface is moved away from the second socket.

These and other objects, advantages and features of this invention will be apparent from the following description taken with reference to the accompanying drawings, wherein is shown the preferred embodiments of the invention.

BRIEF DESCRIPTION OF DRAWINGS

FIG. 4 is a sectional view of the apparatus of this invention taken at 4—4 of FIG. 1.

BEST MODE FOR CARRYING OUT THE INVENTION

Figure 1:
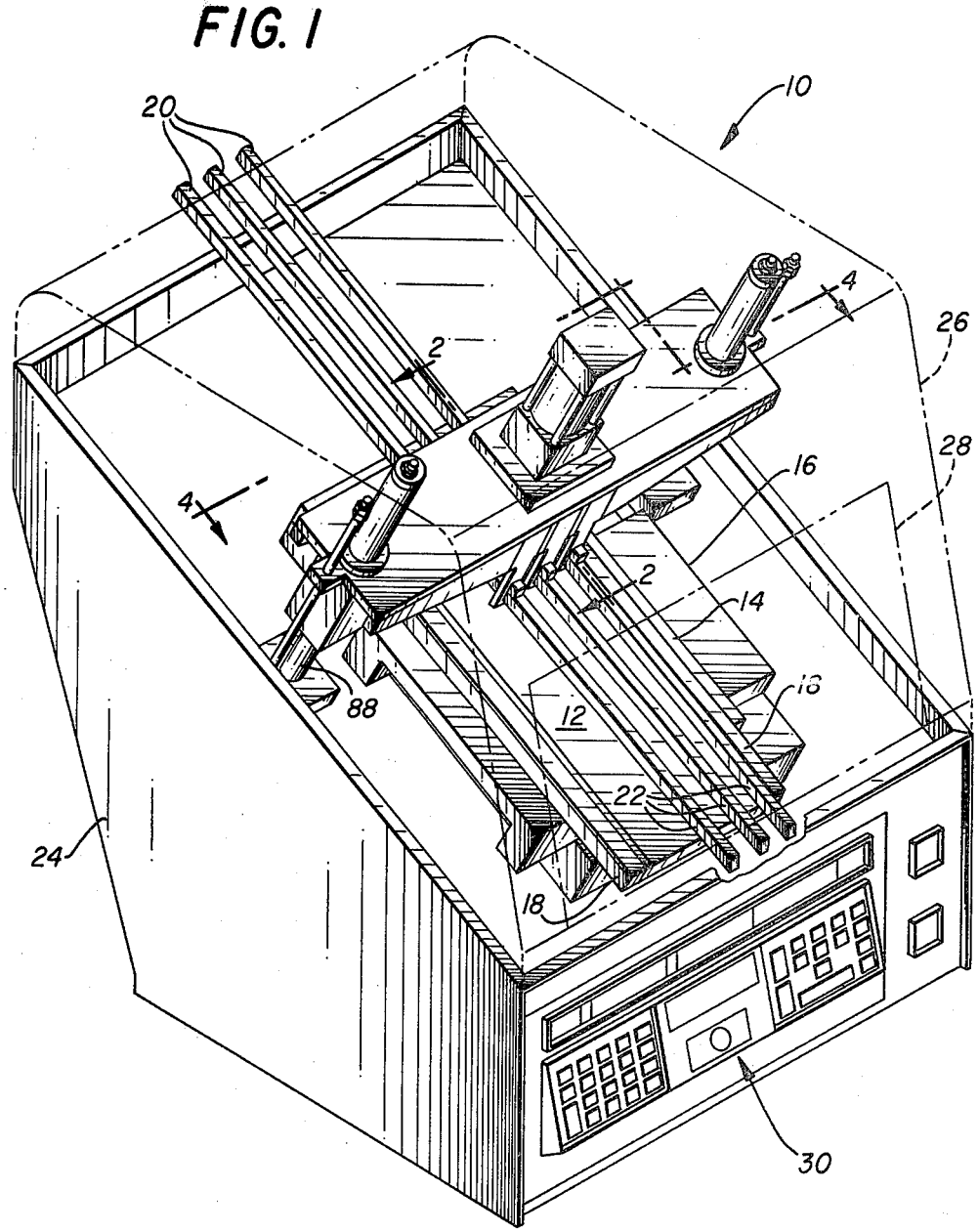
FIG. 1 is a perspective view of an apparatus according to the present invention for loading and unloading circuit packages.

Referring now to the drawings, and in particular to FIG. 1, an apparatus according to the present invention for loading circuit packages into sockets and for unloading circuit packages from sockets is referred to generally by reference numeral 10. Apparatus 10 loads circuit packages into sockets located on burn-in board 12 which is mounted on lateral slide 14. Lateral slide 14 is slidingly mounted on a longitudinal slide 16. Burn-in board 12 is mounted on lateral slide 14 by means of mount 18. Gravity feed 20 feeds circuit packages for loading into apparatus 10, and second gravity feed 22 removes unloaded circuit packages from the apparatus.

Apparatus 10 is mounted on a cabinet 24 and covered by a transparent cowling 26 and a transparent operator door 28. Programmable controller 30 controls the lateral and longitudinal movements of burn-in board 12 in accordance with operator inputs specifying the spacing of sockets on the burn-in board.

Figure 2:
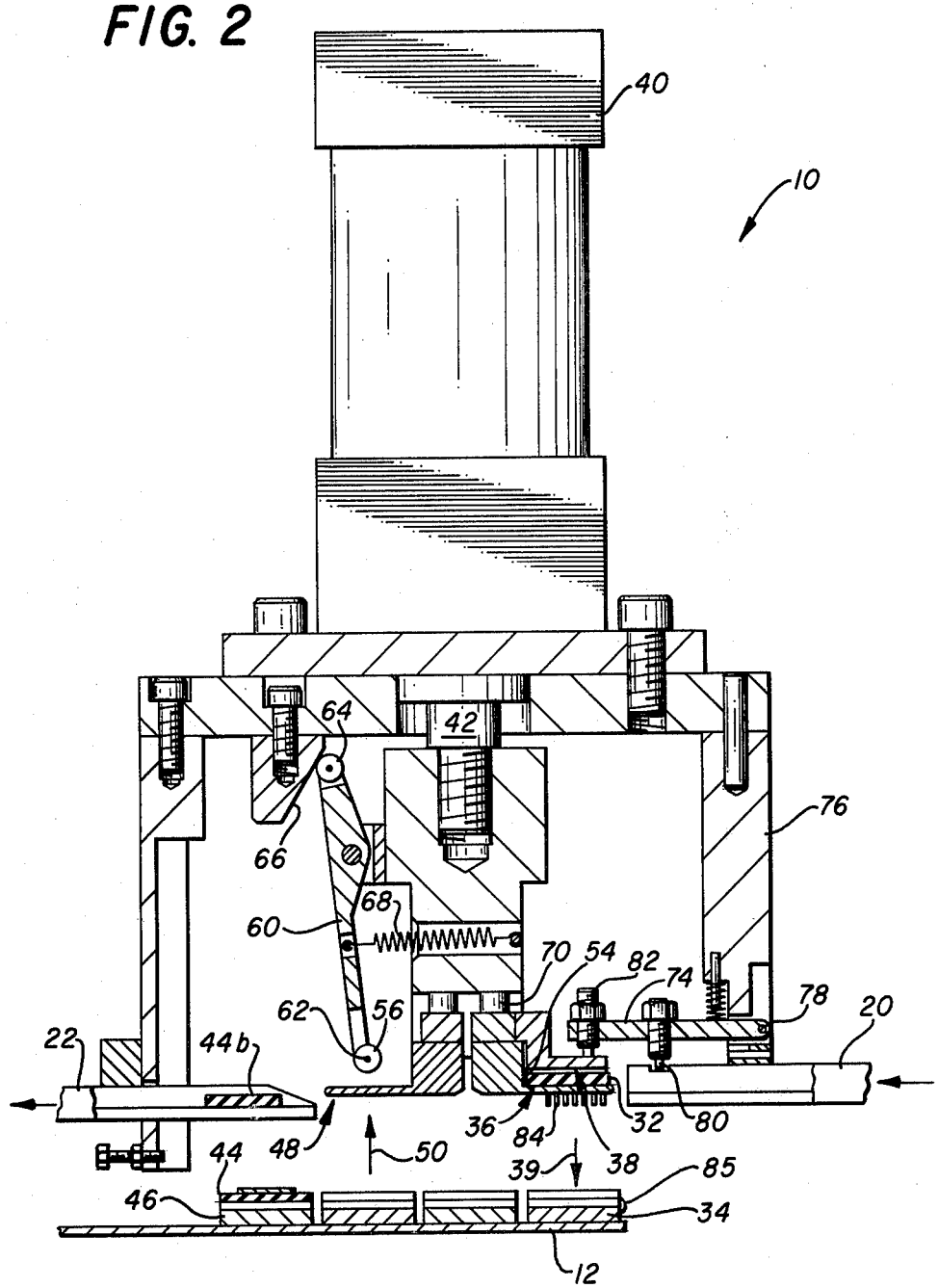
FIG. 2 is a sectional view of the apparatus of FIG. 1 taken at 2—2 of FIG. 1.

Referring now to FIG. 2, an apparatus 10 according to the present invention for loading a first circuit package 32 into a first socket 34 includes the combination of a first support surface 36 for supporting first circuit package 32 from underneath the package, a pressure pad 38 spaced apart from first support surface 36 for applying pressure to a circuit package when the circuit package is being loaded into a socket, and means for moving first support surface 36 and pressure pad 38 toward first socket 34 in a direction 39 substantially perpendicular to the plane of first support surface 36 for loading first circuit package 32 into first socket 34. Socket 34 is the standard socket (see FIG. 4) which is well known in the industry for the particular DIP being loaded into the burn-in board for testing. Contacts (not shown) in the socket 34 are configured to accept and mate with the pins 84 of circuit package 32. The particular configuration of the socket is dictated by the particular DIP being loaded for testing. Sockets 34 are attached to the printed circuit burn-in boards by well known soldering techniques. The movement of the support surface and pressure pad toward the socket is relative to the socket, and the means could move the socket or all three elements. One such means includes air cylinder 40 which drives the combination of first support surface 36 and pressure pad 38 through piston rod 42.

Apparatus 10 can also be used for extracting a second circuit package 44 from a second socket 46 which is substantially in line with first socket 34. A second support surface 48 is substantially in line with first support surface 36. Second support surface 48 is for supporting second circuit package 44 while second circuit package 44 is being removed from second socket 46. Apparatus 10 also includes means for moving second support surface 48 relative to second socket 46 away from second socket 46 in a direction 50 substantially perpendicular to the plane of second support surface 48 for unloading second circuit package 44. The means also includes air cylinder 40 operating on support surface 48 through piston rod 42 in one embodiment.

Throughout this description, the phrase "the plane of the . . . support surface" is used to mean the plane in which the bottom of the circuit package is supported, and the phrase "support surface" is used to mean that part of the structure which actually supports the bottom of the circuit package so that a support made up of a number of pointed projections will still form a support surface and define a plane of the support surface within the meaning of these words.

Figure 3:
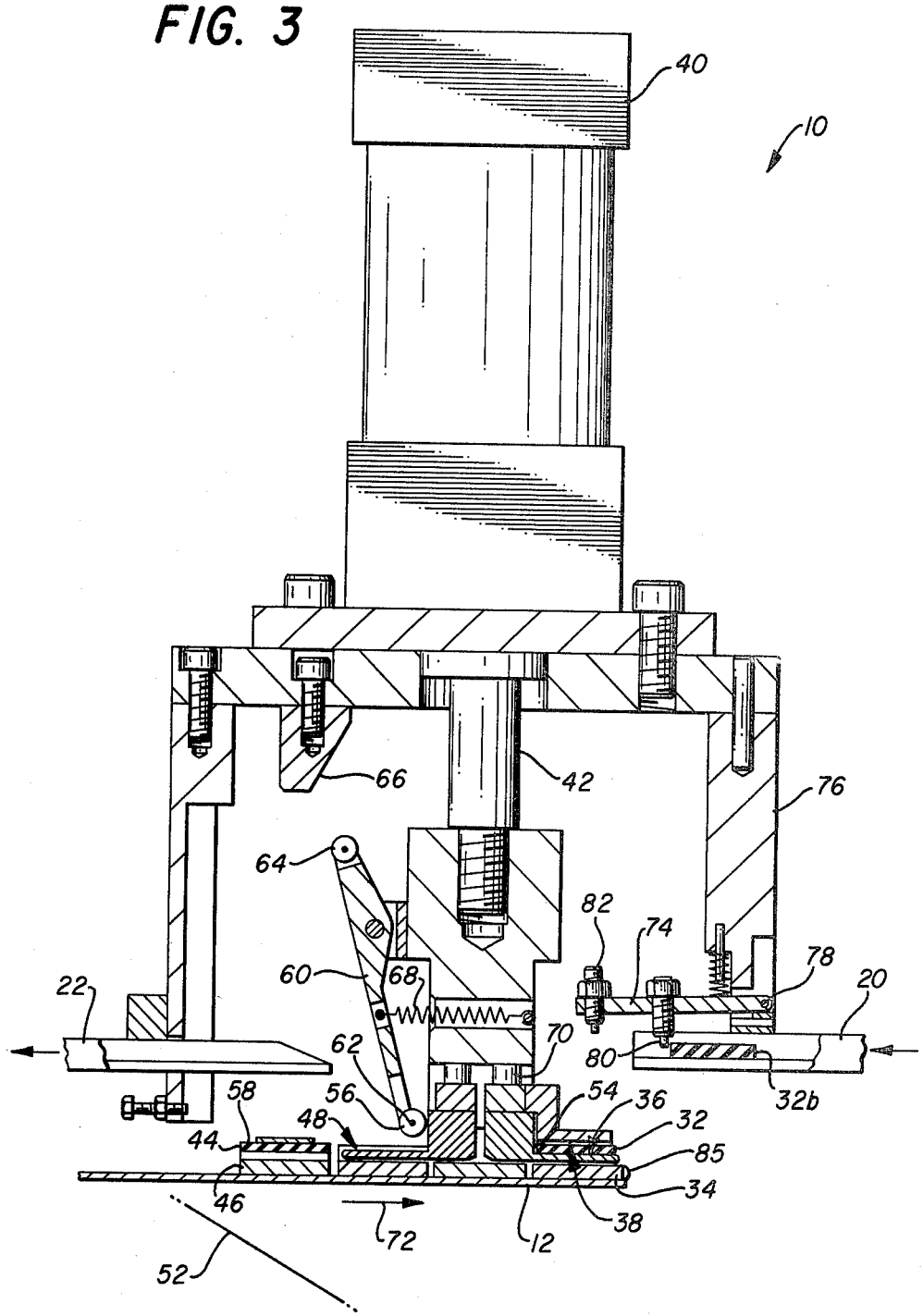
FIG. 3 is a sectional view similar to that of FIG. 2 showing the support surfaces moved into a position which is near the sockets.

Referring also to FIG. 3, support surfaces 36 and 48 are inclined to the horizontal 52 with first support surface 36 higher than second support surface 48. One suitable angle of incline is approximately 30 degrees. Apparatus 10 also includes a circuit package stop 54 located at the lower end of first support surface 36, and a roller 56 spaced apart from second support surface 48 for applying pressure to the top 58 of second circuit package 44. Means are provided for moving roller 56 toward the upper end of second support surface 48 as shown in FIG. 3 when positioning second circuit package 44 opposite second support surface 48 and toward the lower end of second support surface 48 as shown in FIG. 2 for ejecting second circuit package 44 from second support surface 48 when the second circuit package has been extracted from second socket 46. The means for moving roller 56 includes a lever 60 located above and predominantly perpendicular to second support surface 48, means 62 for rotatably attaching roller 56 to the lower end of lever 60, a cam follower 64 attached to the upper end of lever 60, and a cam 66 in contact with cam follower 64, as shown in FIG. 2. Moving second support surface 48 away from second socket 46 moves roller 56 toward the lower end of second support surface 48, thus giving a flipping motion to second circuit package 44 which helps send circuit package 44 into gravity feed 22 as illustrated with circuit package 44b in FIG. 2. Spring 68 returns lever 60 so that roller 56 is moved toward the upper end of second support surface 48 as second support surface 48 is again lowered.

Apparatus 10 also includes means 70 for fixing the position of first and second support surfaces 36 and 48 relative to each other. Second support surface 48 aligns with first support surface 36 so that the means for moving the first support surface and pressure pad toward first socket 34 and the means for moving the second support surface away from second socket 46 move both the first and second support surfaces together. Movement in both cases is relative. Either the support surfaces or the sockets or both can be moved. A means for moving the sockets with respect to the support surfaces when the circuit packages are loaded in their respective sockets, in a direction substantially parallel to the support surfaces includes longitudinal slide 16. With reference to FIG. 4, longitudinal slide 16 is mounted for movement by any suitable, well known means (not shown) in a plane substantially parallel to support surface 36 and 48 (see FIG. 2). Lateral slide 14 is mounted for slideable movement on longitudinal slide 16 by any suitable, well known means (not shown) in a plane substantially parallel to support surfaces 36 and 48 but moves in a direction transverse to the direction moved by longitudinal slide 16. Programmable controller 30 controls the means for moving both the longitudinal and lateral slides 16 and 14. The longitudinal slide 16 moves along a plane substantially parallel to a plane defined by gravity feed 20 and 22 (see FIG. 1) and shown by direction 72 (see FIG. 3). With burn-in board 12 and mount 18 mounted on lateral slide 14 by any suitable, well known means (not shown), the burn-in board 12 and sockets 34 are moveable in a plane substantially parallel to support surfaces 36 and 48. After first circuit package 32 is loaded into socket 34, first circuit package 32 is moved in direction 72 and away from circuit package stop 54, which is away from second support surface 48, until it is clear of first support surface 36 while positioning second circuit package 44 opposite second support surface 48. This longitudinal movement of circuit packages 32 and 44 is accomplished by the longitudinal movement of longitudinal slide 16 which is controlled by programmable controller 30. It can thus be seen that, when the support surfaces are in the positions shown in FIG. 3, moving the sockets in direction 72, which is substantially parallel to the support surfaces, slides first circuit package 32 off of first support surface 36 while sliding second circuit package 44 over second support surface 48. Upon raising support surfaces 36 and 48 to the positions shown in FIG. 2, second circuit package 44 will be removed from second socket 46 by second support surface 48.

A circuit package release mechanism 74 is pivotally connected to frame 76 at pivot point 78. Referring particularly to FIG. 3, when the support surfaces are in the lower position, circuit package release mechanism 74 drops so that stop pin 80 prevents circuit package 32b from proceeding further down gravity feed 20. Referring again to FIG. 2, when the support surfaces and pressure pad 38 are in the upper position, support pad 38 lifts screw adjust 82 which removes stop pin 80 from the path of circuit package 32b. Circuit package 32b then proceeds down gravity feed 20 onto first support surface 36.

Light emitting device 85 accurately aligns first socket 34 so that first circuit package 32 can be accurately inserted into the socket without damage to pins 84. Referring also to FIG. 4, light emitting device 85 is detected by a light sensitive device 86 for accurately detecting the leading edge of first socket 34.

In the arrangement illustrated, three different loaders and three different unloaders operate at a single time. The circuit packages which have already been tested are unloaded at the same time that circuit packages which have yet to be tested are loaded. Once an entire row of tested circuit packages has been unloaded and untested circuit packages have been loaded, lateral slide 14 moves burn-in board 12 one socket row, and longitudinal slide 16 moves the burn-in board back to the first column of sockets. Apparatus 10 then proceeds to process the next three rows of sockets.

Support columns 88 support frame 76 with respect to cabinet 24. Parallel adjust screws 90 are used for leveling the operating mechanisms of apparatus 10.

It can now be seen, that when a burn-in board loaded with circuit packages has been fully tested, that an operator merely inserts the burn-in board through operator door 28 and mounts the board on board mount 18. The operator then programs the programmable control 30 for the particular dimensions of the board including the number of rows and columns of sockets, knowing that precise alignment on columns will be taken care of by light emitting device 85 and light sensitive device 86. Apparatus 10 is then started so that the unloaders begin unloading the first column of sockets. In the apparatus as illustrated, when the unloaders begin unloading the third column of sockets, then the loaders begin loading untested circuit packages into the first column of sockets. The apparatus then continues to simultaneously load and unload the burn-in board until the unloaders reach the end of their rows. The loaders then continue to load to the end of the rows at which time the burn-in board is moved over one row and moved back until the unloaders are again at the first column but of the next row.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. An apparatus for loading a first circuit package into a first socket comprising, in combination;
   a first support surface for supporting the first circuit package from underneath the package;
   a pressure pad spaced apart from the first support surface for applying pressure to a circuit package when the circuit package is being loaded into a socket; and
   means for moving the first support surface and pressure pad toward the first socket in a direction substantially perpendicular to the plane of the first support surface for loading the first circuit package into the first socket, said first support surface being positioned to continue to support the first circuit package from underneath the package during loading.

2. An apparatus according to claim 1 for extracting a second circuit package from a second socket which is substantially in line with the first socket, further comprising in combination;
   a second support surface substantially in line with the first support surface for supporting the second circuit package while the second circuit package is being removed from the second socket; and
   means for moving the second support surface away from the second socket in a direction substantially perpendicular to the plane of the second support surface for unloading the second circuit package.

3. An apparatus according to claim 2 wherein the support surfaces are inclined to the horizontal with the first support surface higher than the second support surface, further comprising:

a circuit package stop located at the lower end of the first support surface;

a roller spaced apart from the second support surface for applying pressure to the top of the second circuit package; and means for moving the roller toward the upper end of the second surface when positioning the second circuit package opposite the second support surface and toward the lower end of the second support surface for ejecting the second circuit package from the second support surface when the second circuit package has been extracted from the second socket.

4. An apparatus according to claim 3 further comprising in combination:

means for fixing the position of the first and second support surfaces relative to each other wherein the second support surface aligns with the first support surface and pressure pad toward the first socket and the means for moving the second support surface away from the second socket move both the first and second surfaces; and means for moving the sockets with respect to the support surfaces when the circuit package are loaded in their respective sockets, in a direction substantially parallel to the support surfaces wherein the first circuit package is moved away from the circuit package stop until it is clear of the first support surface while positioning the second circuit package opposite the second support surface.

5. An apparatus according to claim 4 further comprising:

a gravity circuit package feeder substantially in line with the first support surface for feeding the first circuit package onto the first support surface.

6. An apparatus according to claim 3 wherein the means for moving the roller comprises in combination:

a lever located above and predominantly perpendicular to the second support surface;

means for rotatably attaching the roller to the lower end of the lever;

a cam follower attached to the upper end of the lever; and a cam in contact with the cam follower wherein moving the second support surface away from the second socket moves the roller toward the lower end of the second support surface.

7. An apparatus according to claim 2 further comprising in combination:

means for fixing the position of the first and second support surfaces relative to each other wherein the second support surface aligns with the first support surface whereby the means for moving the first support surface and pressure pad toward the first socket and the means for moving the second support surface away from the second socket move both the first and second support surfaces; and means for moving the sockets with respect to the support surfaces when the circuit package are loaded in their respective sockets, in a direction substantially parallel to the support surfaces wherein the first circuit package is moved away from the second support surface until it is clear of the first support surface while positioning the second circuit package opposite the second support surface.

8. An apparatus according to claim 1 further comprising:

a gravity circuit package feeder substantially in line with the first support surface for feeding the first circuit package onto the first support surface.

* * * * *